United States Patent [19]

Reisman et al.

[11] Patent Number: 5,112,439
[45] Date of Patent: May 12, 1992

[54] METHOD FOR SELECTIVELY DEPOSITING MATERIAL ON SUBSTRATES

[75] Inventors: Arnold Reisman, Raleigh; Gary W. Jones, Durham, both of N.C.

[73] Assignee: MCNC, Research Triangle Park, N.C.

[21] Appl. No.: 585,238

[22] Filed: Nov. 14, 1990

Related U.S. Application Data

[60] Division of Ser. No. 402,794, Sep. 5, 1989, Pat. No. 5,037,775, which is a continuation-in-part of Ser. No. 278,088, Nov. 30, 1988, abandoned.

[51] Int. Cl.$^5$ .............................. H01L 21/00
[52] U.S. Cl. ................... 156/656; 156/646; 156/651; 437/89; 437/90; 437/108
[58] Field of Search ........ 156/646, 656, 651; 437/89, 90, 108

[56] References Cited

U.S. PATENT DOCUMENTS

| | | | |
|---|---|---|---|
| 3,785,862 | 1/1974 | Grill | 156/17 |
| 3,998,673 | 12/1976 | Chow | 156/17 |
| 4,343,676 | 8/1982 | Tarng | 156/656 |
| 4,394,408 | 9/1982 | Tarng et al. | 156/653 |
| 4,404,235 | 9/1983 | Tarng et al. | 427/89 |
| 4,497,683 | 2/1985 | Celler et al. | 156/603 |
| 4,549,926 | 10/1985 | Corboy, Jr. et al. | 156/653 |
| 4,578,142 | 3/1986 | Corboy, Jr. et al. | 156/644 |
| 4,617,087 | 10/1986 | Iyer et al. | 156/643 |
| 4,653,428 | 3/1987 | Wilson et al. | 118/725 |
| 4,673,592 | 6/1987 | Porter et al. | 156/643 |
| 4,698,316 | 10/1987 | Corby, Jr. et al. | 156/647 |
| 4,740,483 | 4/1988 | Tobin | 437/187 |
| 4,741,928 | 5/1988 | Wilson et al. | 427/250 |
| 4,786,352 | 11/1988 | Benzing | 156/643 |
| 4,786,615 | 11/1988 | Liaw et al. | 437/89 |
| 4,837,051 | 6/1989 | Farb et al. | 427/97 |

FOREIGN PATENT DOCUMENTS

| | | |
|---|---|---|
| 0273629 | 7/1988 | European Pat. Off. |
| 0238024 | 8/1988 | European Pat. Off. |
| 60-63505 | 10/1986 | Japan |
| 61-224313 | 10/1986 | Japan |
| 224313 | 10/1986 | Japan |
| 1330720 | 9/1973 | United Kingdom |

OTHER PUBLICATIONS

"Materials Science and Technology—The Use of Phase Diagrams in Technical Materials", pp. 1-90; ©1976.
Thermodyanmic Analyses of Open Tube Germanium Disproportionation Reactions, A. Reisman and S. A. Alyanakyan, Journal of the Electrochemical Society, vol. III, No. 10, Oct. 1964, pp. 1154-1164.
Low Pressure Chemical Vapor Deposition of Tungsten on Polycrystalline and Single-Crystal Silicon via the Silicon Reduction, K. Y. Tsao and H. H. Busta, J. Electrochem. Soc., Solid-State Science and Technology, Nov. 1984, pp. 2702-2708.
Dielectric and Polisilicon Film Deposition, A. C. Adams, *VLSI Technology*, edited by S. M. Sze, McGraw-Hill Book Co., pp. 93-95.

(List continued on next page.)

*Primary Examiner*—David A. Simmons
*Assistant Examiner*—George A. Goudreau
*Attorney, Agent, or Firm*—Bell, Seltzer, Park & Gibson

[57] ABSTRACT

An alternating cyclic (A.C.) method for selectively depositing materials, on the surface of a substrate without depositing the material on an adjacent mask layer. A gas of a reducible compound of the material and a reducing gas, preferably hydrogen, are simultaneously flowed through a reaction chamber to deposit the material on the substrate surface and to a lesser extent on the mask layer. Then, the flow of reducing gas is interrupted to cause the reducible compound gas to etch the material which forms on the mask layer in a disproportionation reaction. The deposition and etch steps are repeated in an alternating cyclic fashion until the requisite thickness is deposited. The process may take place in a single reaction chamber, using only the reducible compound gas and pulsed flow of the reducing gas.

28 Claims, 1 Drawing Sheet

OTHER PUBLICATIONS

Selective Low Pressure Chemical Vapor Deposition of Tungsten, E. K. Broadbent and C. L. Ramiller, Journal of Electrochemical Society, Solid-State Science and Technology, Jun. 184, pp. 1427–1433.

Silicon Processing for the VLSI Era, vol. 1, Process Technology, S. Wolf and R. N. Tauber, Lattice Press, pp. 400–403.

Silicon Process for the VLSI Era, vol. 1, Process Technology, S. Wolf and R. N. Tauber, Lattice Press, pp. 1545–156.

VLSI Fabrication Principles, Silicon and Gallium Arsenide, S. K. Ghandhi, John Wiley & Sons, pp. 422–423.

Growth and Etching of Germanium Films by Chemical Vapor Deposition in a $GeCl_4$–$H_2$ Gas System, H. Ishii and Y. Takahashi, J. Electrochem. Soc.: Solid-State Science and Technology, Jun. 1988, pp. 1539–1543.

Silicon Processing for the VLSI Era, vol. 1: Process Technology, S. Wolf and R. N. Tauber, Lattice Press, pp. 166–167.

VLSI Fabrication Principles, Silicon and Gallium Arsenide, S. K. Ghandhi, John Wiley & Sons, pp. 422–429; 438–439 and 460–461.

METHOD FOR SELECTIVELY DEPOSITING MATERIAL ON SUBSTRATES

CROSS REFERENCE TO RELATED APPLICATION

This application is a divisional of co-pending application Ser. No. 07/402,794 filed Sep. 5, 1989 now U.S. Pat. No. 5,037,775 which is itself a continuation-in-part of then copending application Ser. No. 07/278,088 filed Nov. 30, 1988 now abandoned.

FIELD OF THE INVENTION

This invention relates to the manufacture of integrated circuits and more particularly to a method for selectively depositing a material on substrates without depositing the material on adjacent masking surfaces.

BACKGROUND OF THE INVENTION

In the manufacture of integrated circuit chips, the use of tungsten (W), molybdenum (Mo) or other refractory metals for electrical contacts is well known. Typically, electrical contacts must be formed on exposed regions of a semiconductor substrate through openings in a patterned mask layer, typically silicon dioxide ($SiO_2$), silicon nitride ($Si_3N_4$) or another insulator. A persistent problem in the art has been how to selectively deposit tungsten on the surface of the semiconductor substrate without depositing tungsten on the mask layer. If tungsten deposits on the mask layer, it may form a short circuit between adjacent contacts, thereby rendering the device inoperable.

The need for selective deposition of materials other than refractory metals is also well known in the manufacture of integrated circuit chips. For example, non-refractory metals often must be deposited in exposed regions of a substrate through openings in a patterned mask layer. Often, semiconductor materials such as silicon or germanium must be similarly deposited. Selective deposition of these semiconductor materials may require deposition of amorphous or polycrystalline semiconductor material. Alternatively, a monocrystalline deposition, often referred to as an epitaxial deposition, may be required. As is the case for refractory metals, a persistent problem in the art has been in how to deposit non-refractory metal, semiconductor or other material on the surface of the substrate without depositing the material on the mask layer.

Prior art techniques for depositing tungsten on the surface of a silicon substrate typically begin with a substitution reaction in which tungsten from tungsten hexafluoride ($WF_6$) source gas in the presence of hydrogen substitutes for the silicon (Si) at the exposed surface of the semiconductor substrate according to the following reaction:

(1) $2WF_6(gas) + 3Si(substrate) \rightarrow 2W(substrate) + SiF_4(gas)$

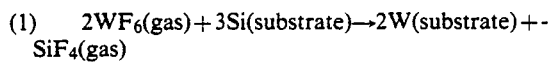

This reaction is a truly selective one in that the tungsten hexafluoride will not react with a silicon dioxide or silicon nitride mask layer. However, this reaction is self-limiting in that after a few hundred Ångstroms of silicon is converted to W and the exposed silicon surface is completely sealed by W, no further substitution takes place. At this point, the hydrogen and tungsten hexafluoride gases interact to create a gas reduction reaction as follows:

(2) $WF_6(gas) + 3H_2(gas) \rightarrow W(deposited) + 6HF(gas)$

In this reaction W is deposited on the substrate in a nucleation type of process in which discrete sites of tungsten are deposited and then grow to form a continuous layer. It has been found that it is impossible to avoid nucleation centers from forming on the mask layer as well after a certain thickness, typically 2000Å or less, has been deposited. When depositing thick films of W (that is films thicker than about 2000Å or less), it has been found that tungsten nucleation on the mask surfaces causes a loss of selectivity in the tungsten deposition process. Eventually, a continuous layer of tungsten bridging the mask surface is formed, rendering the device inoperable.

Many techniques for eliminating or removing nucleation sites on the mask surfaces have been proposed so that selective deposition on the semiconductor surface may take place. Unfortunately, each of these techniques also produces a new set of problems for the tungsten deposition process. For example, U.S. Pat. No. 4,617,087 to Iyer et al discloses the use of $NF_3$ and a plasma in the reaction chamber to create a simultaneous etching condition for the tungsten. The amount of NF3 and the plasma power coupled into the chamber are such as to ensure that the mask surface is kept clean at all times. Since the deposition rate on the exposed W surfaces is higher than on the mask surfaces, there will be net deposition on these areas despite the etching action. Unfortunately, the Iyer et al method requires the introduction of a new gas ($NF_3$) into the process so that at least three simultaneous gas kinetic processes must be controlled and balanced. Moreover, a plasma needs to be struck and maintained in the reaction chamber, thereby greatly increasing the complexity of the process and of the system.

Other techniques for removing the nucleated refractory metal from the mask layer are disclosed in published European Patent Application No. 238,024 to Shioya et al (Sep. 23, 1987). Shioya discloses three techniques for removing the tungsten nucleation sites from the mask layer. The techniques are: (a) heating the substrate in hydrogen gas to produce hydrofluoric acid (HF) etchant from residual $WF_6$ in the chamber; (b) wet etching in an HF solution; or (c) dry etching in nitrogen trifluoride ($NF_3$) gas. Repeated deposition and removal steps are employed to deposit the required thickness of tungsten.

Unfortunately, the first Shioya technique is based on the hope that there will be residual $WF_6$ within the reaction chamber or on the walls of the chamber. A stable and reproducible process cannot be designed around the presence of residual $WF_6$ in the chamber. The second (wet etch) technique requires removal of the specimen from one reaction chamber and the use of a second reaction chamber for wet etch. Finally, the third technique ($NF_3$ dry etch) introduces a new gas into the deposition process requiring the control and balance of three simultaneous gas kinetic processes as in the Iyer, et al. patent. It is apparent that those skilled in the art have sought, and have failed to find, an appropriate method for removing nucleation sites on a mask layer during a tungsten deposition process.

Attempts have also been made to deposit materials other than refractory metal on the surface of a silicon, or other monocrystalline substrate. Examples are silicon on silicon, germanium on germanium or silicon on sapphire. During such processes, nucleation sites form on the mask surfaces, thereby causing a loss of selectivity. An appropriate method for removing nucleation sites on a mask layer deposition of materials other than refractory metals has heretofore not been found.

Prior art techniques for depositing silicon or other semiconductor materials onto a substrate typically employ conventional deposition from a semiconductor-containing gas mixture. See for example U.S. Pat. No. 3,998,673 to Chow which discloses the use of silicon tetrachloride and hydrogen for selective silicon epitaxy. This technique typically results in deposition of unwanted discrete nucleation sites of silicon on the mask.

Many techniques for eliminating or removing silicon or semiconductor nucleation sites on the mask surfaces have been proposed. Unfortunately, as was the case for refractory metal deposition, each of these techniques also produces a new set of problems. For example, U. S. Pat. No. 4,497,683 to Cellar et al. discloses the use of $SiCl_4 + H_2$ for deposition followed by an HCl etch or an in-situ etch using the byproducts of the silicon deposition reaction. Unfortunately, an HCl etch requires introduction of a new gas (HCl) into the process so that at least three simultaneous gas kinetic processes must be controlled and balanced. An in-situ etch relies on the proper byproducts of the silicon deposition reaction being present in the critical concentrations. A stable and reproducible process is difficult to design based on an in-situ byproduct etch.

Another technique for removing silicon nucleation sites is disclosed in U.S. Pat. No. 4,578,142 to Corby, Jr., et al. A two stage epitaxial silicon deposition and etch cycle is disclosed. During the first stage, silicon is deposited from a gas mixture which includes silicon source gas and a carrier gas. A silicon etching gas may also be included. In the second stage, silicon nucleation sites on the mask are etched in a mixture of silicon etching gas and a carrier gas. The stages are repeated to build up the required thickness of silicon. In one embodiment, dichlorosilane is used as the silicon source gas while hydrochloric acid is used as an etch gas during both the first and second stages, and hydrogen is also used as the carrier gas during both stages. Unfortunately, this process requires a simultaneous deposition and etch in the first stage, which is difficult to control in a repeatable manner. Moreover, this process requires control of three simultaneous reactive gas kinetics, i.e. dichlorosilane, hydrochloric acid and hydrogen.

As was the case for refractory metals, it is apparent that those skilled in the art have sought, and have failed to find, an appropriate method for removing nucleation sites on a mask layer during a semiconductor deposition or epitaxy process.

SUMMARY OF THE INVENTION

It is therefore an object of the present invention to provide an improved method for depositing materials, such as monocrystalline, polycrystalline and amorphous semiconductors and refractory and nonrefractory metals, on exposed regions of substrates.

It is another object of the invention to provide a method for selectively depositing materials on substrates in which nucleation sites on an adjacent mask layer are removed.

It is a further object of the invention to provide a selective deposition process in which many simultaneous gas kinetic processes need not be balanced and controlled.

It is still another object of the invention to provide a selective deposition and removal process which may be practiced in a single reaction chamber.

It is yet another object of the invention to provide a method of selectively and reproducibly depositing material, wherein an arbitrarily thick material layer may be deposited.

These and other objects are provided by a method of depositing materials, for example refractory and nonrefractory metals and semiconductors, on the surface of a substrate in which a gas flow of a reducible compound of the material and a reducing gas are provided to thereby deposit the material on the surface and to a lesser extent on the mask layer in a reduction reaction. The reducing gas is preferably hydrogen, however other reducing gases such as carbon monoxide may be employed. Then, according to the invention, the flow of the reducing gas only is stopped or interrupted to thereby cause the reducible compound of the material to etch the material on the mask layer in a "disproportionation" or similar reaction in which the nuclei are made volatile. As is well known to those having skill in the art, a disproportionation reaction is an "auto-oxidation" reaction in which the material oxidizes and reduces itself. Uniquely, the very same compound is employed to deposit the material and etch the material. The compound behaves differently depending upon the reaction in which it is made to participate.

The flowing and stopping steps are repeated in a continuous alternating cyclic (A.C.) fashion until a predetermined thickness of material is deposited. Argon or other inert gas may be employed as a carrier gas to modulate the rates at which the deposition and etching reactions occur.

Stated another way, according to the invention a continuous gas flow of a reducible compound of the material to be deposited is provided in the reaction chamber and a pulsed flow of reducing gas, preferably hydrogen, is also provided. During the reducing gas pulses, the material is deposited on the surface and to a lesser extent on the mask layer. Between reducing gas pulses, nucleation sites of the material on the mask layer are etched in a disproportionation reaction, using the very same compound which had previously been employed to cause deposition of the desired material. The etch rate of the nucleation sites in unwanted deposition sites is greater than that of the continuous material film on the desired substrate surface because of the nucleation sites' greater surface energy. However, some of the material deposited on the semiconductor surface is also removed in a manner similar to a resputtering process. It has been demonstrated, in the case of tungsten, for example, that the amount of desired material etching may be kept very small.

According to the invention, deposition and removal of material are provided by pulsing the flow of reducing gas in a continuous process. Any material which can participate in both a reduction type of reaction and a disproportionation or similar type reaction may be selectively deposited according to the present invention. For example, and without limiting the above definition of "material", any one or more of silicon, germanium, gallium arsenide or metal may be selectively deposited on any one or more of silicon, germanium, gallium arsenide or metal. Alloys of the above may also be deposited on alloys of the above. Doped or undoped semiconductors or alloys thereof may be deposited upon doped or undoped semiconductors or alloys thereof or metal. Deposition conditions for semiconductor materials may be controlled to provide polycrystalline or monocrystalline deposition depending upon temperature, gas composition and other reaction conditions. Amorphous deposition may also be provided.

According to the invention, control and balance of three or more simultaneous gas kinetic processes is not required, nor is the introduction of new chemical substances. A plasma need not be struck. In fact, the same material is employed as a deposition and etching material. The deposition and etching reactions may therefore take place in the same reaction chamber and do not rely on the presence of residual materials from previous process steps. Thus, a simple, continuous and reproducible A.C. process is provided in which desired thicknesses of materials may be selectively deposited.

In addition to the above advantages, the method of the present invention has been found to provide two unexpected results when selectively depositing refractory metals. First, the resistivity of the deposited refractory metal has been found to be lower than the resistivity of the refractory metal deposited using only a gas reduction deposition step. Lower resistance contacts, vias and interconnections are thereby provided. Moreover, the silicon substrate layer upon which refractory metal has been deposited according to the present invention has been found to be free of "worm holes" or "mouse holes" (tunnels) when compared to a substrate upon which metal is deposited using only a gas reduction deposition. Accordingly, the invention results in a higher quality refractory metal layer and less substrate damage as well.

The present invention includes the invention described and claimed in copending application Ser. No. 278,088, filed Nov. 30, 1988, the disclosure of which is incorporated herein by reference. Application Ser. No. 278,088 describes a process for selectively depositing refractory metal on a substrate using an alternating cyclic (A.C.) deposition and etch process, in which a flow of refractory metal halide gas and hydrogen gas are provided to thereby deposit the refractory metal on the surface and to a lesser extent on the mask layer in a hydrogen reduction reaction. Then, the flow of hydrogen gas only is stopped or interrupted in periodic fashion to thereby cause the refractory metal halide gas to etch unwanted nuclei of the refractory metal present on the mask, in a disproportionation reaction. The flowing or stopping steps are repeated in a continuous process until a predetermined thickness of refractory metal is deposited.

The present invention also stems from the realization that the process described in Application Ser. No. 278,088 may be employed to deposit nonrefractory metals, semiconductors or other materials in an alternating cyclic reduction and etching process. It has also been realized that the pulsed hydrogen process described in application Ser. No. 278,088 may be extended to reduction with gases other than hydrogen. A simple, reproducible selective area deposition process for these materials is thereby provided to fill a long felt need in the art.

DESCRIPTION OF THE PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, applicants provide this embodiment so that this disclosure will be thorough and complete, and will fully convey the scope of the invention to those skilled in the art.

Figure 1A:
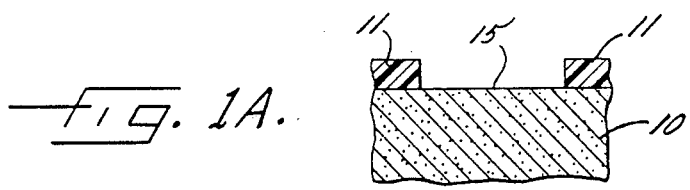
FIGS. 1A–1C are schematic cross-sectional views of an integrated circuit chip showing a method for selectively depositing metals, semiconductors or other materials thereon according to the present invention.
Figure 1B:
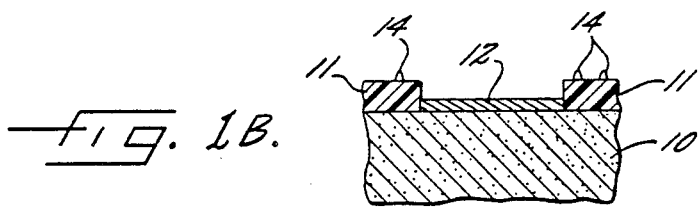

Referring now to FIG. 1A, a semiconductor substrate 10 includes an exposed surface 15 and a patterned mask layer 11. It will be understood by those having skill in the art that the exposed surface 15 may be silicon, germanium or any other semiconductor, metal or any other surface to be metallized, and that patterned mask layer 11 may be silicon dioxide ($SiO_2$), silicon nitride ($Si_3N_4$), polyimide or other conventional mask layers upon which metallization is not desired. Patterned mask layer 11 is preferably any material which does not react significantly with the vapor phase or depositing species in a chemical vapor deposition process and which can tolerate the temperatures involved in the process. Since reaction (1) is not a necessary part of the selective material deposition process of the present invention, it is not necessary that the exposed surface be restricted to silicon, germanium or other material that undergoes a displacement reaction with the reducible compound to be used for depositing the desired material. For example, silicon may be deposited on silicon. Referring now to FIG. 1B, in order to deposit a refractory metal according to the invention refractory metal halide gas (e.g. $WF_6$) and hydrogen gas are introduced into the system to create deposition reaction (2) described above. While hydrogen gas is preferred, reducing gases other than hydrogen, for example carbon monoxide, may also be employed. As shown in FIG. 1B, a layer 12 of refractory metal is deposited, which may be accompanied by formation of unwanted nucleation sites 14 on mask layer 11. It will be understood by those having skill in the art that inert carrier gases such as argon or nitrogen may also flow through the chamber. It will also be understood by those having skill in the art that the process may initially begin with the flow of pure refractory metal halide gas to create self-limiting substitution reaction (1) described above, if the substrate is a semiconductor material which can participate in the substitution reaction.

After a predetermined time the flow of hydrogen gas is terminated, so that only refractory metal halide gas flows, in argon or another inert gas. This refractory metal halide gas etches the three-dimensional surfaces of nucleation sites 14 much faster than it etches planar refractory metal layer 12 in the following disproportionation reaction:

(3) $5WF_6(gas) + W(deposited) \rightarrow 6WF_5(gas)$

Figure 1C:
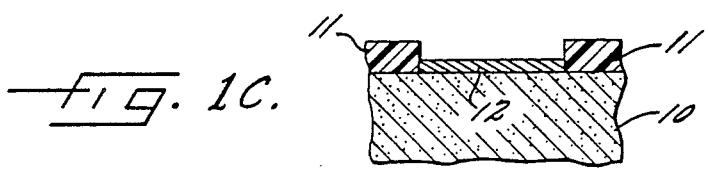

Volatile subfluorides ($WF_5$ and/or $WF_4$) are created. The nucleation sites 14 are entirely removed while removing only a small thickness of layer 12 (FIG. 1C). To deposit a predetermined layer of refractory metal, the continuous deposition and etch steps shown in FIG. 1B and 1C, respectively, are repeated until the requisite refractory metal layer 12 is deposited.

Still referring to FIG. 1B, deposition of nonrefractory metals, semiconductors or other materials according to the present invention will now be described. According to the invention, a gas of a reducible compound of the material to be deposited, and a reducing gas preferably hydrogen, are introduced into the system to produce a reduction deposition reaction. For example, when titanium (Ti) is to be deposited, titanium tetrachloride, tetrabromide or tetraiodide ($TiX_4$, where X is chlorine, bromine or iodine) may be employed in the following hydrogen reduction reaction:

(4a) $TiX_4(gas) + 2H_2(gas) \rightarrow Ti(deposited) + 4HX(gas)$, where X=Cl,Br or I.

When silicon is to be deposited, silicon tetrachloride may be employed in the following hydrogen reduction reaction:

(4b) $SiX_4(gas) + 2H_2(gas) \rightarrow Si(deposited) + 4HX(gas)$, where X=Cl,Br or I.

When germanium is to be deposited, germanium tetrachloride may be employed in the following hydrogen reduction reaction:

(4c) $GeX_4(gas) + 2H_2(gas) \rightarrow Ge(deposited) + 4HX(gas)$, where X=Cl,Br or I.

Compounds such as gallium arsenide may also be deposited in the following reduction reaction:

(4d) $2GaI_3(gas) + 3H_2(gas) + As_2(gas) \rightarrow 2GaAs(deposited) + 6HI$.

It will be understood by those having skill in the art that when depositing silicon, germanium or other semiconductor materials, the deposition conditions such as temperature and deposition rate may be controlled to provide either polycrystalline or monocrystalline (epitaxial) deposition. For example, epitaxial growth of silicon may take place on a masked monocrystalline silicon substrate using reaction 4b using 2% by volume $SiCl_4$ and the remaining gas either $H_2$ or an $H_2$-Ar mixture, at temperatures between 900°–1050° C.

Still referring to FIG. 1B, the hydrogen reduction reaction results in a layer 12 of the material 12 being deposited, which may be accompanied by formation of unwanted nucleation sites 14 on mask layer 11. It will be understood by those having skill in the art that inert carrier gases such as argon or nitrogen may also flow through the chamber.

After a predetermined time, the flow of hydrogen or other reducing gas is terminated, so that only the gas of the reducible compound of the material to be deposited flows, in argon or another inert gas. This gas etches the three-dimensional surfaces of nucleation sites 14 much faster than it etches planar layer 12, by undergoing a disproportionation reaction. For example, when titanium has been deposited, the following disproportionation reaction takes place:

(5a) $TiX_4(gas) + Ti(deposited) \rightarrow 2TiX_2(gas)$

When silicon has been deposited, the following disproportionation reaction takes place:

(5b) $SiX_4(gas) + Si(deposited) \rightarrow 2SiX_2(gas)$.

When germanium has been deposited, the following disproportionation reaction takes place:

(5c) $GeX_4(gas) + Ge(deposited) \rightarrow 2GeX_2(gas)$.

When gallium arsenide has been deposited, the following disproportionation reaction takes place:

(5d) $GaI_3(gas) + 2GaAs(deposited) \rightarrow 3GaI(gas) + As_2(gas)$.

In this case, both the $H_2$ and $As_2$ flows are simultaneously interrupted during the nuclei removal portion of the A.C. process.

The nucleation sites 14 are entirely removed while removing only a small thickness of layer 12 (FIG. 1C). To deposit a predetermined thickness of material, the continuous deposition and etch steps shown in FIG. 1B and 1C are repeated in an A.C. cyclic fashion until the requisite layer 12 is deposited.

Figure 2:
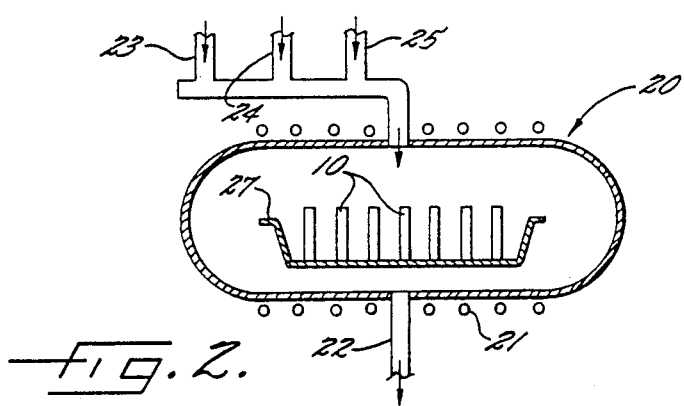
FIG. 2 is a schematic drawing of a first chemical vapor deposition (CVD) reaction chamber in which the present invention may be practiced.

Referring now to FIG. 2, a schematic illustration of a first chemical vapor deposition (CVD) reaction chamber 20 which may be employed to practice the present invention is illustrated. The CVD reaction chamber may be any conventional hot wall or cold wall reaction chamber, however, a hot wall chamber is preferred for refractory metal deposition since it enhances the cold to hot reaction of equation (3). For example a model 5101 CVD system marketed by Varian Corp., Palo Alto, Calif., a model 8402 marketed by Genus, Mountain View, Calif. or a model 211 marketed by Spectrum, Phoenix, Ariz. may be employed. FIG. 2 schematically illustrates a horizontal hot wall chamber. Shown in the chamber 20 is wafer boat 27 holding vertical semiconductor wafers 10. For selective tungsten deposition, the chamber may be heated, for example to 450° C., using a resistance coil 21 or other conventional heating means. The chamber walls and the incoming gases may all be heated to create an isothermal reaction. Also provided are inlet 23 for argon or other inert carrier gas, inlet 24 for tungsten hexafluoride gas or the gas of the reducible compound of the material to be deposited, and inlet 25 for the reducing gas such as hydrogen. An exhaust manifold 22 is also provided. It has been found that small deposition chambers work best so that rapid and uniform gas changes in proximity of the wafers and good temperature control may be obtained.

It will be recognized by those having skill in the art that the chamber walls will be somewhat hotter than the interior of the chamber due to the proximity of the walls to coil 21, thereby enhancing the cold to hot transport process of equation (3) during the time period when the hydrogen gas is not flowed.

Figure 3:
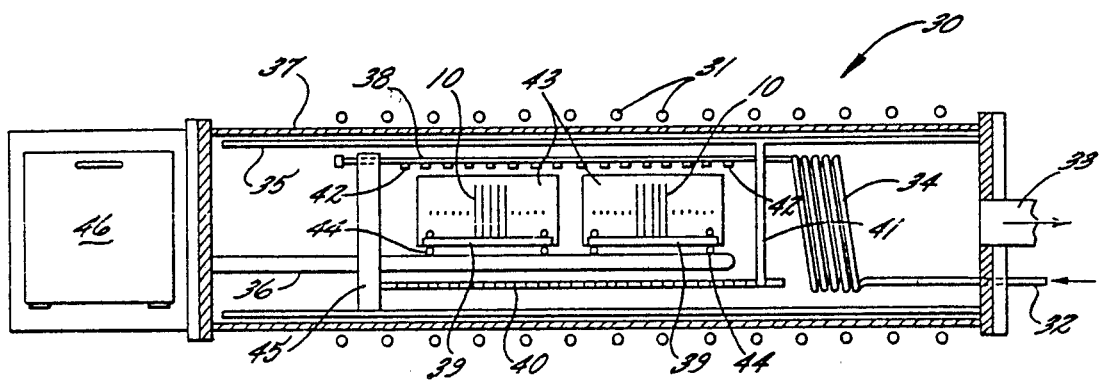
FIG. 3 is a schematic drawing of a second chemical vapor deposition (CVD) reaction chamber in which the present invention may be practiced.

Referring now to FIG. 3, a schematic illustration of a second CVD reaction chamber 30 is shown. Chamber 30 is a load locked, vertical flow, hot wall, low pressure CVD system, the design of which is optimized for practicing selective tungsten deposition according to the invention. Nickel is preferred for as many parts of chamber 30 as possible because nickel forms nonvolatile subfluorides which are stable and do not shed.

Chamber 30 includes an outer tube 37, of quartz or preferably of nickel. A heating coil 31 surrounds tube 37. A liner 35, also preferably of nickel, protects outer tube 37 from damage. A load lock 46 permits entry and exit of wafer boats 43, which include a carrier 39 for wafers 10. Rods 44 support wafer carriers 39 on cantilever 36. A support ring 45 and a baffle 41 define the sides of an inner chamber, through which vertical flow of reducing gas and $WF_6$ or other reducible compound gas, in an argon ambient, is provided.

Inlet 32 for either reducing gas or the reducible compound gas is shown. A second inlet (not shown) for the other gas may be provided behind inlet 32. Inlet 32 provides gas flow to a preheating coil 34 and to an outlet manifold 38 having a plurality of orifices 42 therein. It will be understood that a second preheating coil may be nested within heating coil 34 and a second outlet manifold may be located behind manifold 42; so that two independent gas delivery systems for reducing gas and the reducible compound gas respectively may be provided. Either or both gases may flow in an argon ambient. The gases flow vertically across wafers 10 and exit via vertical flow baffle 40 to exhaust 33.

EXAMPLE

The following experiment was conducted to verify the efficacy of the invention of application Ser. No. 278,088. This experiment also verifies the efficacy of the A.C. material deposition process of the present invention. The experiment was conducted in the hot wall deposition chamber illustrated in FIG. 3. As a control, a simple $H_2$-$WF_6$ mixture at a total pressure of 1 torr was passed over a silicon wafer containing a silicon dioxide mask layer on half the wafer. The temperature of the silicon wafer was maintained at 450° C. The $H_2$ flow rate was 500 sccm, and the $WF_6$ flow rate was 50 sccm. Also present was an argon flow at 400 sccm. Under these conditions, tungsten was deposited at a rate of approximately 400Å/min. The deposition was conducted for 10 minutes, growing approximately 4,000Å of tungsten on the silicon surface. Many "tunnels" or worm holes were observed in the silicon, and many nucleation sites of tungsten were observed on the silicon dioxide.

The process according to the invention used essentially the same gas composition, the same total pressure and the same temperature. It differed in that, after being on for 30 seconds, the $H_2$ flow was stopped for 10 seconds. This cycle was repeated 20 times. A growth rate of 220 Å/min. of elapsed time was observed, and a bulk resistivity about half of the control process was found. No nucleation sites were observed on the silicon dioxide, and no tunneling or worm holes were observed in the silicon. Excellent results were also obtained for 30 seconds on, 15 seconds off cycles of $H_2$ flow.

The above example illustrates that a low resistivity tungsten layer may be selectively deposited without creating worm holes and without creating nucleation sites on the mask layer. While applicants do not wish to be bound by any theory, it is theorized that low resistivity tungsten is created because of partial removal of deposited tungsten in a manner similar to resputtering which is known to improve sputtered metal quality. In addition, the process of the present invention may lead to decreased incorporation of beta-phase tungsten as compared with a conventional deposition process.

It will be understood by those having skill in the art that according to the present invention, material layers of arbitrary thickness (for example, up to 8000Å or more) may be selectively deposited. Deposit and etch cycle times may be varied over ranges which may be established for each specific system implementation, with an $H_2$ "on" to "off" ratio of 2:1 to 4:1 being preferred. For tungsten deposition a 2:1 ratio is most preferred. It is also important not to allow deposition times to be too long without the pulsed etch cycle being employed. For example, 30 seconds $H_2$ on and 10 seconds $H_2$ off is preferred to 600 seconds $H_2$ on and 200 seconds $H_2$ off. For tungsten deposition 30 seconds $H_2$ on and 15 seconds $H_2$ off is most preferred. Accordingly, the ratio of $H_2$ on/off time as well as the pulse frequency should be adjusted. Reaction temperature may also be varied over a wide temperature range. It will also be understood that the process of the present invention may be employed to deposit materials on any metal surface, silicon (monocrystalline or polycrystalline), other semiconductor metal silicides or any other thermally stable surface to which the materials will adhere, while avoiding deposition on $SiO_2$, $Si_3N_4$, $Al_2O_3$, polyimide or any other surface with which the material has a high dissociation constant (low adhesion).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of selectively depositing a predetermined thickness of a material on the surface of a substrate having a mask layer thereon and located in a reaction chamber, comprising the steps of:
    heating said reaction chamber;
    reducing a gas of a reducible compound of said material to deposit said material on said surface and which results in formation of nuclei of said material on said mask layer, by flowing a gas of a reducible compound of said material and a reducing gas through said heated reaction chamber;
    effecting a disproportionation reaction, by interrupting the flow of the reducing gas while continuing the flow of the reducible compound gas in the heated reaction chamber in the absence of laser excitation and in the absence of plasma excitation, to etch the nuclei of said material which form on said mask layer, and to a lesser extent etch the material on said surface; and
    repeating said reducing and disproportionation nuclei etching steps of selectively deposit said predetermined thickness of said material on said surface.

2. The method of claim 1 wherein said material comprises a compound semiconductor material.

3. The method of claim 1 wherein said material comprises a refractory metal.

4. The method of claim 1 wherein said material comprises a non-refractory metal.

5. The method of claim 1 wherein said reducing gas comprises hydrogen.

6. The method of claim 3 wherein said refractory metal comprises tungsten.

7. The method of claim 1 wherein said reducing step is practiced for about 30 seconds and said nuclei etching step is practiced for about 15 seconds.

8. The method of claim 1 wherein the time ratio of said reducing step and said nuclei etching step is about 2:1.

9. The method of claim 1 wherein said reducing and etching steps are performed in an argon ambient atmosphere.

10. The method of claim 1 wherein said substrate is a semiconductor substrate, wherein said gas of a reducible compound of said material is a refractory metal halide gas, and when said reducing gas is hydrogen.

11. The method of claim 10 wherein said substrate is silicon and said refractory metal halide gas is tungsten hexafluoride.

12. The method of claim 1 wherein said reducing step is practiced for about 30 seconds and said nuclei etching step is practiced for about 10 seconds.

13. The method of claim 1 wherein the time ratio of said reducing step and said nuclei etching step is about 3:1.

14. The method of claim 1 wherein said reducing step is performed by flowing the reducible compound gas through said heated reaction chamber at a predetermined flow rate, and wherein said etching step is performed by interrupting the flow of the reducing gas while continuing the flow of the reducible compound gas at the predetermined flow rate.

15. A method of selectively depositing a predetermined thickness of a material on the surface of a substrate having a mask layer thereon and located in a reaction chamber, comprising the steps of:
heating said reaction chamber;
reducing a gas of a reducible compound of said material to deposit said material on said surface and which results in formation of nuclei of said material on said mask layer, by exposing said substrate to a gas of a reducible compound of said material and a reducing gas in said heated reaction chamber;
effecting a disproportionation reaction, by exposing said substrate to the reducible compound gas, without the reducing gas, in the absence of laser excitation and in the absence of plasma excitation, to etch the nuclei of said material which form on said mask layer, and to a lesser extent etching the material on said surface; and
repeating said reducing and disproportionation nuclei etching steps of selectively deposit said predetermined thickness of said material on said surface.

16. The method of claim 15 wherein said material comprises a compound semiconductor material.

17. The method of claim 15 wherein said material comprises a refractory metal.

18. The method of claim 15 wherein said material comprises a non-refractory metal.

19. The method of claim 15 wherein said reducing gas comprises hydrogen.

20. The method of claim 17 wherein said refractory metal comprises tungsten.

21. The method of claim 15 wherein said reducing step is practiced for about 30 seconds and said nuclei etching step is practiced for about 15 seconds.

22. The method of claim 15 wherein the time ratio of said reducing step and said nuclei etching step is about 2:1.

23. The method of claim 15 wherein said reducing and etching steps are performed in an argon ambient atmosphere.

24. The method of claim 15 wherein said substrate is a semiconductor substrate, wherein said gas of a reducible compound of said material is a refractory metal halide gas, and when said reducing gas is hydrogen.

25. The method of claim 24 wherein said substrate is silicon and said refractory metal halide gas is tungsten hexafluoride.

26. The method of claim 15 wherein said reducing step is practiced for about 30 seconds and said nuclei etching step is practiced for about 10 seconds 27. The method of claim 15 wherein the time ratio of said reducing step and said nuclei etching step is about 3:1.

28. The method of claim 15 wherein said reducing step is performed by exposing the substrate to the reducible compound gas at a predetermined concentration, and wherein said etching step is performed by exposing the substrate to the reducible compound gas at the predetermined concentration, without the reducing gas.

* * * * *

UNITED STATES PATENT AND TRADEMARK OFFICE
CERTIFICATE OF CORRECTION

PATENT NO. : 5,112,439
DATED : May 12, 1992
INVENTOR(S) : Reisman et al.

It is certified that error appears in the above-identified patent and that said Letters Patent is hereby corrected as shown below:

On the Title page, col. 2, under "Other Publications"

line 6, "vol." should be --Vol.--.

line 5, "vol." should be --Vol.-- first column, line 8, "vol." should be --Vol.--.

first column, line 10, "1545-156" should be --155-156--.

Page 2, second column, line 7, "vol." should be --Vol.--.

Column 1, line 59, "$SiF_4$(gas)" should be --$3SiF_4$(gas)--.

Column 5, line 58, "application" should be --Application--.

Column 8, line 5, "$H_2$and" should be --$H_2$ and--.

UNITED STATES PATENT AND TRADEMARK OFFICE
CERTIFICATE OF CORRECTION

PATENT NO. :     5,112,439

DATED      :     May 12, 1992

INVENTOR(S) :    Reisman et al.

It is certified that error appears in the above-identified patent and that said Letters Patent is hereby corrected as shown below:

Column 11, line 31, "of" should be --to--.

Column 12, line 25, after "seconds" please insert --.--.

Signed and Sealed this

Eleventh Day of January, 1994

Attest:

Attesting Officer

BRUCE LEHMAN

Commissioner of Patents and Trademarks